(12) United States Patent
Herklotz et al.

(10) Patent No.: US 6,242,106 B1
(45) Date of Patent: Jun. 5, 2001

(54) FINE WIRE MADE OF A GOLD ALLOY, METHOD FOR ITS PRODUCTION, AND ITS USE

(75) Inventors: Günter Herklotz, Bruchköbel; Lutz Schräpler, Karlstein; Christoph Simons, Biebergemünd; Jürgen Reuel, Gelnhausen, all of (DE); Y. C. Cho, Inchon (KR)

(73) Assignee: W. C. Hereaeus GmbH & Co. KG, Hanau (DE)

( * ) Notice: Subject to any disclaimer, the term of this patent is extended or adjusted under 35 U.S.C. 154(b) by 0 days.

(21) Appl. No.: 09/305,767

(22) Filed: May 5, 1999

(30) Foreign Application Priority Data

May 13, 1998 (DE) .............................. 198 21 395

(51) Int. Cl.$^7$ ................. C22C 5/02; H01B 1/02
(52) U.S. Cl. .......... 428/606; 420/508; 420/509; 420/510; 420/512; 148/678
(58) Field of Search ............ 428/606; 420/512, 420/508, 509, 510; 148/678, 430; 228/180.5, 262.1; 164/462; 29/827, 825

(56) References Cited

U.S. PATENT DOCUMENTS

| | | |
|---|---|---|
| 2,947,623 | 8/1960 | Lincoln . |
| 4,885,135 | 12/1989 | Hosoda et al. . |
| 4,938,923 | 7/1990 | Kujiraoka et al. . |
| 5,989,364 | * 11/1999 | Kitamura .................. 148/430 |
| 6,103,025 | * 11/1999 | Herklotz et al. .......... 148/430 |

FOREIGN PATENT DOCUMENTS

| | | |
|---|---|---|
| 1 169 140 | 4/1964 | (DE) . |
| 1608161 | * 4/1971 | (DE) . |
| 201 156 | 7/1983 | (DE) . |
| 743 679 | 11/1996 | (EP) . |
| 761 831 | 3/1997 | (EP) . |
| 52-51867 | 4/1977 | (JP) . |
| 61-143954 | * 7/1986 | (JP) . |
| 4-74836 | * 3/1992 | (JP) . |
| 6-112258 | 4/1994 | (JP) . |
| 11-87396 | * 3/1999 | (JP) . |
| WO 96/17382 | 6/1996 | (WO) . |

OTHER PUBLICATIONS

Römpp Chemie Lexicon, Band 1, 10 Auflage (1996), pp. 647–648, Georg Thieme Verlag Stuttgart—New York (no month).

* cited by examiner

Primary Examiner—John J. Zimmerman
(74) Attorney, Agent, or Firm—Frishauf, Holtz, Goodman, Langer & Chick, P.C.

(57) ABSTRACT

A fine wire made of an alloy of gold which contains 0.6 to 2 weight % of nickel, or an alloy of gold which contains 0.1 to 2 weight % of nickel, 0.0001 to 0.1 weight % of alkaline earth metal and/or rare earth metal, and optionally 0.1 to 1.0 weight % of platinum and/or palladium . The fine wire is distinguished by a favorable electrical conductivity and a good ratio of strength to elongation. The fine wire is suitable both for wire bonding of semiconductor devices and for producing the ball bumps of flip-chips.

16 Claims, 1 Drawing Sheet

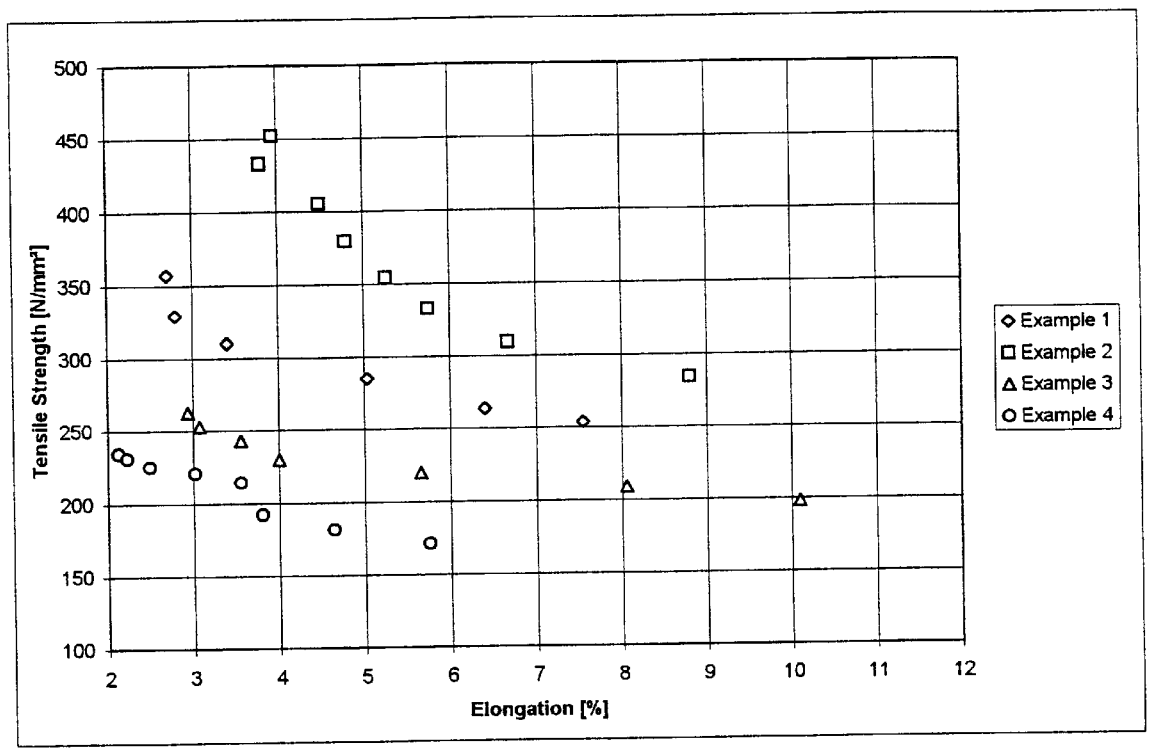
Figure

FINE WIRE MADE OF A GOLD ALLOY, METHOD FOR ITS PRODUCTION, AND ITS USE

BACKGROUND INFORMATION

1. Field of the Invention

The present invention relates to a fine wire of a gold alloy containing nickel for bonding semiconductor devices, to a method for its production, and to its use.

2. Background of the Invention

For contacting or bonding semiconductor devices, suitable wires, also known as bonding wires, must have good electrical properties and good mechanical strength values. The diameter of the wires can be approximately 10 to 200 µm and is typically in the range of approximately 20 to 60 µm; the diameter is selected to suit the intended purpose.

The bonding wires often comprise gold of high purity, or recently also gold alloys. The latter have the advantage of greater strength and, if they contain only a slight quantity of alloy formers, their electrical conductivity is reduced only slightly over pure gold.

For instance, the use of an alloy of gold and 0.001 to 0.1% of one or more rare earth metals, especially in the form of cerium mixed metal, or yttrium is known from German Patent DE 16 08 161 C for producing lead wires in integrated circuits. This alloying of the gold with slight quantities of rare earth metals or yttrium has markedly better strength and elongation performance at heating temperatures up to 500° C., without any substantial change in other properties of the gold, such as hardness, chemical resistance, or electrical resistance.

Gold and rare earth metal alloys for bonding wires are also described in German Patent Disclosures DE 32 37 385 A (U.S. Pat. No. 4,885,135) and DE 39 36 281 A (U.S. Pat. No. 4,938,923), Japanese Patent Disclosure JP 6-112258 A, and European Patent Disclosures EP 0 743 679 A and EP 0 761 831 A.

DE 32 37 385 A relates to a fine gold alloy wire with high tensile strength, comprising a gold alloy with 0.0003 to 0.01 weight % of rare earth metal, especially cerium, and optionally germanium, beryllium and/or calcium in addition.

DE 39 36 281 A describes a gold wire for connecting a semiconductor device, comprising high-purity gold alloyed with slight quantities of lanthanum, beryllium, calcium, and elements from the platinum group, especially platinum and/or palladium.

The bonding wire known from JP 6-112258 A, reported in Chemical Abstracts, Vol. 121, 89287m, comprises a gold alloy with from 1 to 30% of platinum and 0.0001 to 0.05% of scandium, yttrium and/or rare earth metal, and optionally 0.0001 to 0.05% of beryllium, calcium, germanium, nickel, iron, cobalt, and/or silver.

In EP 0 743 679 A, a bonding wire of a gold and rare earth metal alloy containing platinum is also proposed. The alloy comprises gold and slight quantities of platinum (0.0001 to 0.005 weight %), silver, magnesium and europium, and can also contained cerium, for example, in a quantity of from 0.0001 to 0.02 weight %.

In EP 0 761 831 A, a fine wire comprising a platinum- and/or palladium-containing gold and rare earth metal alloy is described. The alloy comprises 0.1 to 2.2 weight % of platinum and/or palladium, 0.0001 to 0.005 weight % of beryllium, germanium, calcium, lanthanum, yttrium and/or europium, the remainder being gold. The wire is produced by melting the elements forming the alloy in a crucible, with cooling from bottom to top of the alloy melt in the crucible to obtain a casting (ingot), and ensuing rolling, drawing and annealing. It has an elongation of 3 to 8% and a Young modulus of 6800 to 9000 kgf/mm$^2$.

From JP 52-051867 A, bonding wires of gold and 0.004 to 0.5 weight % of at least one of the metals in the group comprising nickel, iron, cobalt, chromium and silver is known. The bonding wires, with a diameter of 30 µm, have good bonding properties and—compared with bonding wires of pure gold—improved strength. Nickel in a quantity of 0.004 weight %, at 6% elongation produces a strength of 13 kg/mm$^2$ (130 N/mm$^2$), and in a quantity of 0.5 weight % at 14% elongation produces a strength of 24 kg/mm$^2$ (240 N/mm$^2$). Higher quantities of nickel are thought to reduce the mechanical properties; for a bonding wire of a gold alloy with 0.6 weight % of nickel at an elongation of 5%, a strength of then only 10 kg/mm$^2$ (100 N/mm$^2$) is for instance stated. The production of the bonding wires is not described in JP 52-051867 A.

In East German Patent Disclosure DD 201 156, gold/silver alloys for bondable microwires are proposed that as additives contain copper, nickel and/or cobalt in concentrations of ≦5 mass % and iron, aluminum, palladium, platinum, antimony, bismuth, germanium, and arsenic as typical contaminants (not above 100 ppm). The alloys are melted in the vacuum induction furnace and cast to ingots. The subsequent extrusion of the ingots is followed by cold forming to the final diameter (25 to 30 µm) with suitable heat treatments.

Gold/nickel alloys are also known for other purposes. For instance, Published, Examined German Patent Application 1 169 140 teaches the use of a gold/nickel alloy with 1 to 20 weight % of nickel as material for producing weak-current contacts for circuits with self-induction in the range from $10^{-7}$ to $10^{-4}$ Henry. To raise the temperature of recrystallization, the gold/nickel alloy can also contain silver, platinum, palladium, zirconium, copper, cobalt, iron, chromium and/or manganese.

SUMMARY OF THE INVENTION

With JP 52-051867 A as its point of departure, an object of the invention was to discover a fine wire of a gold alloy that contains nickel, and which has a good ratio of strength to elongation. A method is also disclosed which in an economical way enables continuous production of the fine wire with excellent quality. The fine wire should be suitable both for wire bonding and for producing ball bumps for the flip-chip technique, as described, for instance, in German Patent DE 44 42 960 C.

According to the present invention, the object is attained by a fine wire comprising an alloy, which is characterized in that it comprises gold and from 0.6 to 2 weight % of nickel.

According to the present invention, the object is also attained by a fine wire comprising an alloy, which is characterized in that it comprises from 0.1 to 2 weight % of nickel and 0.0001 to 0.1 weight % of at least one element selected from the group comprising the alkaline earth metals and rare earth metals, with the remainder being gold.

BRIEF DESCRIPTION OF THE DRAWING

The FIGURE is a graph of tensile strength versus elongation at fracture for Examples 1 to 4 hereinbelow.

DETAILED DESCRIPTION OF THE INVENTION

The fine wire of the present invention has proved to be especially useful if the nickel content of the gold alloy is from 0.7 to 1.5 weight %. Preferably, the alkaline earth metal and/or rare earth metal content of the gold alloy is from 0.001 to 0.01 weight %, if present.

In some cases, fine wires of a gold/nickel alloy that additionally contains 0.1 to 1.0 weight % of platinum, palladium, or both platinum and palladium have proved to be highly advantageous.

In terms of the present invention, the term "alkaline earth metal" is understood to mean beryllium, magnesium, calcium, barium and strontium, while "rare earth metal" means lanthanum (ordinal number 57) and the 14 elements following lanthanum, that is, cerium (ordinal number 58) through lutetium (ordinal number 71), also known in the professional literature as "elements of the lanthanum series".

The alkaline earth metal preferably comprises beryllium, magnesium, calcium or a mixture of at least two of these alkaline earth metals. If mixtures of beryllium and calcium are used, those comprising 50 weight % each of beryllium and calcium have proved to be especially suitable.

The rare earth metal preferably comprises cerium, or a mixture of cerium and one or more of the rare earth metals having the ordinal numbers 57 and 59–71. Cerium mixed metal has proved to be especially suitable. Typically a mixture of 50–60% cerium, 25 to 30% lanthanum, 10 to 15% neodymium, 4 to 6% praseodymium and 1% iron, and slight amounts of other rare earth metals is usually called a cerium mixed metal (Römpp Chemie Lexikon (Römpp's Chemical Lexicon), Georg Thieme Verlag Stuttgart—New York, Vol. 1, 10th Edition (1996), 647).

The fine wire according to the present invention with a typical diameter for bonding wires has all the properties necessary for its use for semiconductor bonding. It is distinguished especially by its favorable electrical conductivity (see Table V hereinbelow), measured in the form of specific electrical resistance, and its very good strength in relation to the elongation (see the Figure). The good strength to elongation ratio of the fine wire contributes substantially to the very quality of the bonded connections.

Surprisingly, the alloy forming of the gold with nickel or with nickel and alkaline earth metal and/or rare earth metal in the quantities complained leads to the higher strength of the fine wire according to the invention, compared with the wires of unalloyed gold and of gold/nickel alloys of JP 52-051867 A. It is also especially surprising that by also alloying alkaline earth metal and/or rare earth metal, a great reduction in the loss of strength from annealing (see Table VI hereinbelow) can be attained.

In the drawing (figure), the strength (tensile strength) [$N/mm^2$] of two fine wires according to the present invention (in Examples 1 and 2) and, for comparison, two fine wires not according to the invention (Examples 3 and 4) is shown as a function of the elongation (breaking elongation) (%): The fine wires of the present invention have greater strength for a given elongation.

In Table V, the chemical composition and the specific electrical resistance of the fine wires both according to the present invention and not according to the embodiments described in the examples and in addition of a fine wire of a gold alloy with 0.8 weight % of iron are shown. Table VI shows the values for the strength of the fine wires described in the examples in the cold-drawn state and at an elongation of 4% and shows the influence of adding beryllium and calcium on the strength. Beryllium and calcium reduce the loss of strength associated with the annealing. The fine wire according to the present invention, because of its favorable properties, can especially advantageously be used for wire bonding including the high-frequency bonding technique being developed, and for producing the ball bumps for flip-chips.

The object of the present invention is also attained in a method for producing a fine wire from a nickel-containing gold alloy for bonding semiconductor components, which according to the present invention is characterized in that a gold alloy comprising (a) gold, 0.6 to 2 weight % of nickel, and optionally 0.1 to 1.0 weight % of platinum, palladium or both platinum and palladium, or (b) gold, 0.1 to 2 weight % of nickel, 0.0001 to 0.1 weight % of at least one element selected from the group of alkaline earth metals and rare earth metals, and optionally 0.1 to 1.0 weight % of platinum, palladium, or both platinum and palladium, with the remainder being gold, is melted; the molten alloy is continuously cast into a strand; the strand is drawn into a wire of typical diameter for bonding purposes; and the wire is annealed.

The method according to the present invention has proved to be especially useful if the molten alloy is continuously cast into a strand of circular cross section, the strand is drawn into a wire, and the wire is annealed at about 300 to 700° C. By the annealing, the initially cold-drawn wire is imparted with the necessary elongation. The melting and continuous casting of the alloy can be done in air, in a protective gas such as argon, or in a vacuum.

In the method of the present invention, melting of a gold alloy with a nickel content of 0.7 to 1.5 weight % is preferred. The addition of alkaline earth metal and/or rare earth metal in a quantity of 0.001 to 0.01 weight % has proven favorable.

As the alkaline earth metal, beryllium, magnesium, calcium, strontium, barium, or a mixture of at least two of these elements can be used. Beryllium, magnesium, calcium or a mixture of at least two of these alkaline earth metals has proved especially suitable. If mixtures of beryllium and calcium are used, then those comprising 50 weight % each of beryllium and calcium are preferred.

As the rare earth metal, especially cerium or a mixture of cerium and one or more rare earth metals with the ordinal numbers 57 and 59–71 is used, the latter preferably in the form of commercially available cerium mixed metal.

The method of the present invention is especially distinguished in that it can be performed continuously and yields products, the cast strand and the drawn wire, of very uniform and constant quality.

For further explanation, in the following examples, fine wires and their production in accordance with the present invention (Examples 1 and 2) and, for comparison, a fine wire of the prior art known from DE 16 08 161 C (Example 3) and a fine wire of gold with a purity of 99.99 weight % (Example 4) will be described. The fine wires are characterized by their elongation (breaking elongation) (%), their strength (tensile strength) ($N/mm^2$), and their specific electrical resistance (ohms $mm^2/m$).

EXAMPLES

Example 1

Fine wire comprising a gold alloy with 0.8 weight % of nickel

The melt of an alloy of 0.8 weight % of nickel and gold as the remainder is cast in a continuous-casting system to a strand of circular cross section. From the strand, a wire with a diameter of 30 $\mu$m is then drawn, and the wire is annealed in air at approximately 300 to 700° C. depending on the elongation to be attained. The strength values (N/mm²) measured as a function of the elongation (%) are shown in Table I.

The specific electrical resistance at room temperature, measured for a wire with a diameter of 275 μm, is 0.045 ohms mm²/m.

TABLE I

| Elongation (%) | Strength (N/mm²) |
| --- | --- |
| cold-drawn | 600 |
| 2.7 | 357 |
| 2.8 | 329 |
| 3.4 | 310 |
| 5.0 | 285 |
| 6.4 | 264 |
| 7.6 | 254 |

Example 2

Fine wire comprising a gold alloy with 0.8 weight % of nickel, 0.001 weight % of beryllium and 0.001 weight % of calcium The melt of an alloy of 0.8 weight % of nickel, 0.001 weight % of beryllium and 0.001 weight % of calcium, with gold as the remainder, is cast in a continuous-casting system to a strand of circular cross section. From the strand, a wire with a diameter of 30 μm is then drawn, and the wire is annealed in air at approximately 300 to 700° C. depending on the elongation to be attained. The strength values (N/mm²) measured as a function of the elongation (%) are shown in Table II.

The specific electrical resistance at room temperature, measured for a wire with a diameter of 275 μm, is 0.046 ohms mm²/m.

TABLE II

| Elongation (%) | Strength (N/mm²) |
| --- | --- |
| cold-drawn | 650 |
| 3.8 | 433 |
| 4.0 | 452 |
| 4.5 | 405 |
| 4.8 | 380 |
| 5.3 | 354 |
| 5.8 | 333 |
| 6.7 | 309 |
| 8.8 | 284 |

Example 3 (comparison)

Fine wire of a gold alloy with cerium mixed metal in accordance with DE 16 08 161 C The melt of an alloy of gold and cerium mixed metal is cast in a continuous-casting system to a strand of a circular cross section. From the strand, a wire with a diameter of 30 μm is then drawn, and the wire is annealed in air at approximately 300 to 600° C. depending on the elongation to be attained. The strength values (N/mm²) measured as a function of the elongation (%) are shown in Table III.

The specific electrical resistance at room temperature, measured for a wire with a diameter of 275 μm, is 0.023 ohms mm²/m.

TABLE III

| Elongation (%) | Strength (N/mm²) |
| --- | --- |
| cold-drawn | 375 |
| 2.9 | 263 |
| 3.1 | 253 |
| 3.6 | 243 |
| 4.0 | 230 |
| 5.7 | 220 |
| 8.1 | 209 |
| 10.1 | 198 |

Example 4 (comparison)

Fine wire of gold with a purity of 99.99 weight %

The melt of gold with a purity of 99.99 weight % is cast in a continuous-casting system to a strand of a circular cross section. From the strand, a wire with a diameter of 30 μm is then drawn, and the wire is annealed in air at approximately 200 to 500° C. depending on the elongation to be attained. The strength values (N/mm²) measured as a function of the elongation (%) are shown in Table IV.

The specific electrical resistance at room temperature, measured for a wire with a diameter of 275 μm, is 0.023 ohms mm²/m.

TABLE IV

| Elongation (%) | Strength (N/mm²) |
| --- | --- |
| cold-drawn | 435 |
| 2.1 | 235 |
| 2.2 | 231 |
| 2.5 | 226 |
| 3.0 | 221 |
| 3.6 | 214 |
| 3.8 | 192 |
| 4.6 | 182 |
| 5.8 | 171 |

TABLE V

| Example | Composition (weight %) | | | | | Specific electrical resistance (ohms mm²/m) |
| --- | --- | --- | --- | --- | --- | --- |
| | Au | Be | Ca | Ni | Fe | |
| 1 | remainder | | | 0.8 | | 0.045 |
| 2 | remainder | 0.001 | 0.001 | 0.8 | | 0.046 |
| 3 (comparison)* | | | | | | 0.023 |
| 4 (comparison) | 99.99 | | | | | 0.023 |
| (comparison) | remainder | | | | 0.8 | 0.227 |

*Gold alloy with cerium mixed metal in accordance with DE 16 08 161 C

TABLE VI

| Example | Composition (weight %) | | | | Tensile strength (N/mm²) | |
| --- | --- | --- | --- | --- | --- | --- |
| | Au | Be | Ca | Ni | Drawn-hard | 4% elongation |
| 1 | remainder | | | 0.8 | 600 | 300 |
| 2 | remainder | 0.001 | 0.001 | 0.8 | 650 | 450 |

TABLE VI-continued

| | Composition (weight %) | | | | Tensile strength (N/mm²) | |
|---|---|---|---|---|---|---|
| Example | Au | Be | Ca | Ni | Drawn-hard | 4% elongation |
| 3 (comparison)* | | | | | 375 | 230 |
| 4 (comparison) | 99.99 | | | | 435 | 200 |

*Gold alloy with cerium mixed metal in accordance with DE 16 08 161 C

It will be appreciated that the instant specification is set forth by way of illustration and not limitation, and that various modifications and changes may be made without departing from the spirit and scope of the present invention.

What is claimed is:

1. A fine wire of a gold alloy for bonding semiconductor devices, wherein the gold alloy consists essentially of 0.6 to 2 weight % of nickel, 0.1 to 1.0 weight % of at least one metal selected from the group consisting of platinum and palladium, with the remainder being gold.

2. The fine wire in accordance with claim 1, wherein the nickel is in an amount of 0.7 to 1.5 weight %.

3. The fine wire in accordance with claim 1, wherein the wire has a diameter of 10 to 200 μm.

4. The fine wire in accordance with claim 1, wherein the wire has a diameter of 20 to 60 μm.

5. A fine wire of a gold alloy for bonding semiconductor devices, wherein the gold alloy consists essentially of 0.1 to 2 weight % of nickel, 0.0001 to 0.1 weight % of at least one element selected from the group consisting of an alkaline earth metal and a rare earth metal, and 0.1 to 1.0 weight % of at least one metal selected from the group consisting of platinum and palladium, with the remainder being gold.

6. The fine wire in accordance with claim 5, wherein the nickel is in an amount of 0.7 to 1.5 weight %.

7. The fine wire in accordance with claim 5, wherein the at least one element selected from the group consisting of the alkaline earth metal and the rare earth metal is in an amount of 0.001 to 0.01 weight %.

8. The fine wire in accordance with claim 6, wherein the gold alloy contains at least one element selected from the group consisting of the alkaline earth metal and the rare earth metal in an amount of 0.001 to 0.01 weight %.

9. The fine wire in accordance with claim 5 wherein the alkaline earth metal which is contained in the gold alloy is at least one element selected from the group consisting of beryllium, magnesium and calcium.

10. The fine wire in accordance with claim 5, wherein the rare earth metal which is contained in the gold alloy is cerium.

11. A method for producing a fine wire according to claim 1 from a gold alloy containing nickel, for bonding semiconductor devices comprising:

(a) melting a gold alloy to provide a molten alloy, said gold alloy selected from the group consisting of (i) a gold alloy consisting essentially of 0.6 to 2 weight % nickel, 0.1 to 1.0 weight % of at least one metal selected from the group consisting of platinum and palladium, with the remainder being gold and (ii) a gold alloy consisting essentially of 0.1 to 2 weight % nickel, 0.0001 to 0.1 weight % of at least one element selected from the group consisting of an alkaline earth metal and a rare earth metal, and 0.1 to 1.0 weight % of at least one metal selected from the group consisting of platinum and palladium, with the remainder being gold;

(b) continuously casting the molten alloy from step (a) into a strand;

(c) drawing the strand from step (b) into a wire of a diameter for bonding to a superconductor device; and (d) annealing the wire from step (c).

12. The method in accordance with claim 11, wherein in step (b) the molten alloy is cast into a strand of a circular cross section.

13. The method in accordance with claim 11, wherein in step (d) the wire is annealed at a temperature of 300 to 700° C.

14. A method of bonding a semiconductor device with a wire, comprising bonding a semiconductor device with the fine wire according to claim 1.

15. A method of bonding a superconductor device with a wire for a high-frequency application comprising bonding a superconductor device with the fine wire according to claim 1.

16. A method for connecting a semiconductor device with a wire in a flip-chip technique, comprising connecting a semiconductor device with the fine wire according to claim 1.

* * * * *